United States Patent
Saugier et al.

(10) Patent No.: US 9,525,094 B2
(45) Date of Patent: Dec. 20, 2016

(54) PROXIMITY AND RANGING SENSOR

(71) Applicants: STMICROELECTRONICS PTE LTD, Singapore (SG); STMICROELECTRONICS (GRENOBLE 2) SAS, Grenoble (FR)

(72) Inventors: Eric Saugier, Villard Bonnot (FR); Wing Shenq Wong, Singapore (SG); David Gani, Singapore (SG)

(73) Assignees: STMicroelectronics (Grenoble 2) SAS, Grenoble (FR); STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 14/671,707

(22) Filed: Mar. 27, 2015

(65) Prior Publication Data

US 2016/0284920 A1 Sep. 29, 2016

(51) Int. Cl.
| | |
|---|---|
| H01L 31/167 | (2006.01) |
| H01L 31/02 | (2006.01) |
| H01L 25/16 | (2006.01) |
| H01S 5/022 | (2006.01) |
| H01S 5/183 | (2006.01) |
| H01L 31/18 | (2006.01) |

(52) U.S. Cl.
CPC ......... H01L 31/167 (2013.01); H01L 25/167 (2013.01); H01L 31/02005 (2013.01); H01L 31/18 (2013.01); H01S 5/0226 (2013.01); H01S 5/02248 (2013.01); H01S 5/02276 (2013.01); H01S 5/183 (2013.01)

(58) Field of Classification Search
CPC ........ H01L 33/62; H01L 33/486; H01L 33/60; H01L 2924/01079; H01L 2224/48
USPC ............................... 257/81, 84, 98; 438/108
See application file for complete search history.

(56) References Cited

U.S. PATENT DOCUMENTS 7,067,926 B2 * 6/2006 Yamazaki ........... H01L 21/6835
257/686

* cited by examiner

*Primary Examiner* — Quoc Hoang
(74) *Attorney, Agent, or Firm* — Seed IP Law Group LLP

(57) ABSTRACT

A proximity sensor having a relatively small footprint includes a substrate, a semiconductor die, a light emitting device, and a cap. The light emitting device overlies the semiconductor die. The semiconductor die is secured to the substrate and includes a sensor area capable of detecting light from by the light emitting device. The cap also is secured to the substrate and includes a light barrier that prevents some of the light emitted by the light emitting device from reaching the sensor area. In one embodiment, the light emitting device and the semiconductor die are positioned on the same side of the substrate, wherein the light emitting device is positioned on the semiconductor die. In another embodiment, the light emitting device is positioned on one side of the substrate and the semiconductor die is positioned on an opposing side of the substrate.

20 Claims, 5 Drawing Sheets

PROXIMITY AND RANGING SENSOR

BACKGROUND

Technical Field

The present application generally relates to semiconductor devices, and more particularly to semiconductor proximity and ranging sensor devices.

Description of the Related Art

FIG. 1A is a top plan view of a conventional proximity sensor 100. The proximity sensor 100 includes a cap 102 having a first aperture 104 and a second aperture 106. FIG. 1B is a cross-sectional view of the proximity sensor 100 along the line IB-IB shown in FIG. 1A.

As shown in FIG. 1B, the cap 102 includes a first cap piece 102a and a second cap piece 102b. An adhesive material 108 secures the first cap piece 102a to the second cap piece 102b An adhesive material 110 secures the cap 102 to a substrate 112. The substrate 112 includes a plurality of contact pads 114. A plurality conductive traces 116 forms electrical connections between one or more of the contact pads 114 on an upper surface of the substrate 112 and one or more of the contact pads 114 on a lower surface of the substrate 112.

An adhesive material 118 secures a light emitting device 120 and a semiconductor die 122 to the substrate 112. The semiconductor die 122 includes a sensor area 124. Light emitted by the light emitting device 120 may exit the proximity sensor 100 via the first aperture 104, be reflected by an object in the vicinity of the proximity sensor 100, enter the proximity sensor 100 via the second aperture 106, and impact the sensor area 124. The proximity sensor 100 outputs a signal indicative of the intensity of light that is incident on the sensor area 124.

The proximity sensor 100 may be mounted to a printed circuit board (not shown) provided in an electronic device (not shown), for example, a cellular telephone. Many other components may be mounted to the same printed circuit board, which must fit within the device. One trend in consumer electronics is for devices to be made smaller while having increased capabilities. Accordingly, it may be desirable to mount more components on smaller printed circuit boards. Thus, it may be desirable to decrease the surface area required to mount each component to a printed circuit board. Accordingly, there is a need for proximity sensors that have smaller footprints than that of the proximity sensor 100.

BRIEF SUMMARY

According to an embodiment, a proximity sensor is provided. The proximity sensor includes a substrate, a semiconductor die, a light emitting device, and a cap. In one embodiment, the semiconductor die, the light emitting device, and the cap are secured to the substrate. In other embodiments, the light emitting device is coupled to the semiconductor die. The substrate has a first plurality of contact pads on a first side of the substrate and a second plurality of contact pads on a second side of the substrate. The semiconductor die has a sensor area on an upper surface of the semiconductor die and a third plurality of contact pads. The light emitting device has a fourth plurality of contact pads and overlies the upper surface of the semiconductor die. The cap has a first aperture positioned above the light emitting device, a second aperture positioned above the sensor area of the semiconductor die, and a light barrier disposed between the light emitting device and the sensor area of the semiconductor die. The semiconductor die may be positioned on the first side of the substrate and the light emitting device may be positioned on the upper surface of the semiconductor die. Additionally, the light emitting device may be positioned on the first side of the substrate and the semiconductor die may be positioned on the second side of the substrate.

According to another embodiment, a method of fabricating a proximity sensor is provided. According to the method, a substrate having a first plurality of contact pads on a first side of the substrate and a second plurality of contact pads on a second side of the substrate is provided. A semiconductor die is coupled to the substrate. The semiconductor die has a sensor area on an upper surface of the semiconductor die and a third plurality of contact pads. A light emitting device is positioned over the upper surface of the semiconductor die. The light emitting device has a fourth plurality of contact pads. A cap is coupled to the substrate. The cap has a light barrier disposed between the light emitting device and the sensor area of the semiconductor die. The method also may include positioning the semiconductor die on the first side of the substrate, positioning the light emitting device on the semiconductor die, forming electrical connections between contact pads of the semiconductor die and contact pads of the light emitting device, and forming electrical connections between contact pads of the semiconductor die and the contact pads on the first side of the substrate. Additionally, the method may include positioning the light emitting device on the first side of substrate, forming electrical connections between contact pads of the light emitting device and contact pads on the first side of the substrate, positioning the semiconductor die on the second side of the substrate, and forming electrical connections between contact pads of the semiconductor die and contact pads on the second side of the substrate. The method also may include positioning the semiconductor die inside a cavity within the substrate using a molding material, forming a plurality of electrical connections through vias in the molding material between contact pads of the semiconductor die and respective contact pads of a redistribution layer on the first side of the substrate, which are in electrical communication with contact pads on the second side of the substrate. The method also may include positioning the light emitting device and the cap on the first side of the substrate or the semiconductor die.

DETAILED DESCRIPTION

Figure 1A:
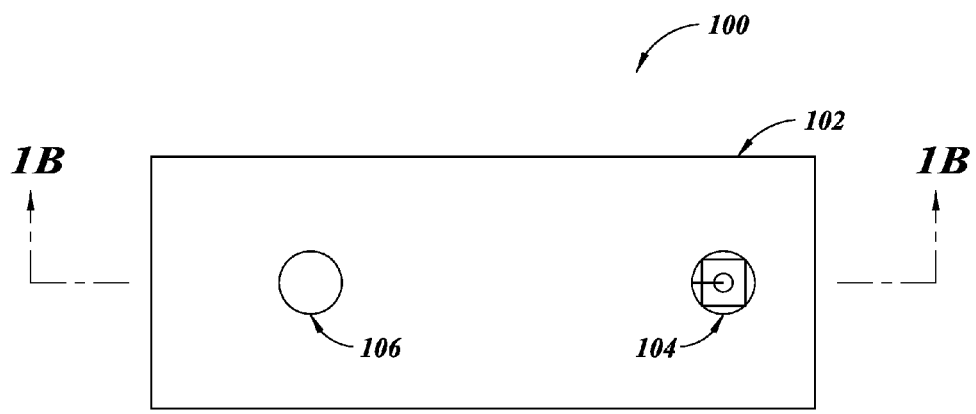
FIG. 1A is a top plan view of a conventional proximity sensor.
Figure 1B:
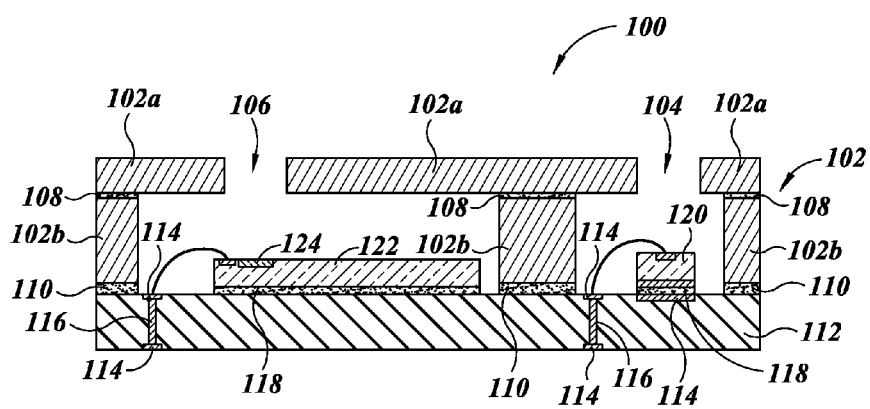
FIG. 1B is a cross-sectional view of the proximity sensor shown in FIG. 1A.
Figure 2A:
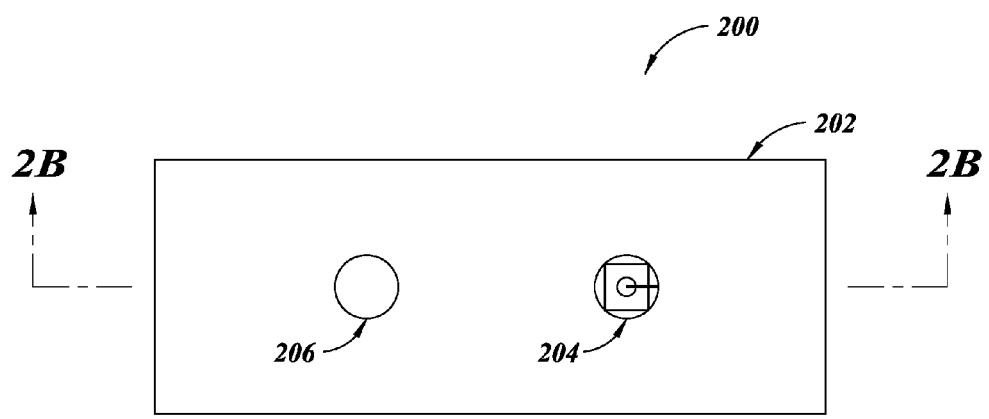
FIG. 2A is a top view of a proximity sensor, according to one embodiment.
Figure 2B:
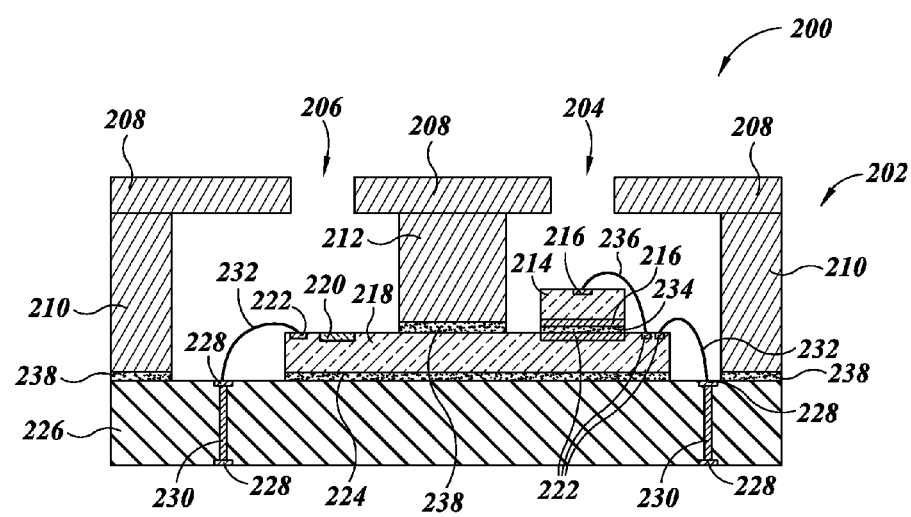
FIG. 2B is a cross-sectional view of the proximity sensor shown in FIG. 2A.

FIG. 2A is a top view of a proximity sensor 200, according to one embodiment. The proximity sensor 200 includes a cap 202 having a first aperture 204 and a second aperture 206. The first aperture 204 and the second aperture 206 may be filled or covered by conventional lenses to improve the optical performance of the proximity sensor 200. Such lenses may be formed from glass, plastic, or epoxy materials, for example, that are attached to the cap 202 using a conventional gluing process or a conventional molding process. FIG. 2B is a cross-sectional view of the proximity sensor 200 along the line 2B-2B shown in FIG. 2A.

As shown in FIG. 2B, the cap 202 includes an upper portion 208, a plurality of side walls 210, and a light barrier 212. In one embodiment, the upper portion 208, the side walls 210, and the light barrier 212 are integrally formed. In one embodiment, the side walls 210 and light barrier 212 are attached to the upper portion 208 with an adhesive material (not shown). In one embodiment, the side walls 210 are part of a substrate 226, which will be explained further below.

The proximity sensor 200 includes a conventional light emitting device 214 having a plurality of contact pads 216. In the embodiment shown in FIGS. 2A and 2B, an upper surface of the light emitting device 214 includes a first contact pad 216 and a lower surface of the light emitting device 214 includes a second contact pad 216. In another embodiment, a pair of contact pads 216 is formed on the lower surface of the light emitting device 214. In one embodiment, the light emitting device 214 is a conventional light emitting diode (LED). In one embodiment, the light emitting device 214 is a conventional vertical-cavity surface-emitting laser (VCSEL).

The proximity sensor 200 also includes a conventional semiconductor die 218. The semiconductor die 218 includes a sensor area 220 and a plurality of contact pads 222. In one embodiment, the sensor area 220 is part of a photodiode. In the embodiment shown in FIG. 2B, an upper surface of the semiconductor die 218 includes the contact pads 222. A conventional epoxy adhesive material 224 secures a lower surface of the semiconductor die 218 to an upper surface of the substrate 226. In one embodiment, the adhesive material 224 is a conventional die attach film adhesive.

The substrate 226 includes a plurality of contact pads 228. An upper surface of the substrate 226 includes some of the contact pads 228 and a lower surface of the substrate 226 includes some of the contact pads 228. A plurality conductive traces 230 forms electrical connections between one or more of the contact pads 228 on the upper surface of the substrate 226 and one or more of the contact pads 228 on the lower surface of the substrate 226. In one embodiment, the substrate 226 is part of a printed circuit board. In another embodiment, the substrate 226 is part of a redistribution layer. In one embodiment, the substrate 226 is formed from silicon. In another embodiment, the substrate 226 is formed from a ceramic material.

A plurality of wires 232 forms electrical connections between two or more of the contact pads 228 on the upper surface of the substrate 226 and two or more contact pads 222 on the upper surface of the semiconductor die 218. In one embodiment, conventional wire bonding machinery connects one end of each of the wires 232 to one of the contact pads 228 on the upper surface of the substrate 226 and then connects the other end of the wire 232 to a respective one of the contact pads 222 on the upper surface of the semiconductor die 218.

A conventional, conductive adhesive material 234 forms an electrical connection between the contact pad 216 on the lower surface of the light emitting device 214 and one of the contact pads 222 on the upper surface of the semiconductor die 218. In one embodiment, the contact pad 216 on the lower surface of the light emitting device 214 is part of a semiconductor die from which the light emitting device 214 is formed. A wire 236 forms an electrical connection between one of the contact pads 222 on the upper surface of the semiconductor die 218 and the contact pad 216 on the upper surface of the light emitting device 214. In one embodiment, conventional wire bonding machinery connects one end of the wire 236 to one of the contact pads 222 on the upper surface of the semiconductor die 218 and then connects the other end of the wire 236 to the contact pad 216 on the upper surface of the light emitting device 214.

A conventional adhesive material 238 secures the cap 202 to the semiconductor die 218 and to the substrate 226. More particularly, the adhesive material 238 secures the side walls 210 to an upper surface of the substrate 226. Although FIG. 2B shows only two side walls 210, the cap 202 includes four side walls 210. The adhesive material 238 also secures the light barrier 212 to an upper surface of the semiconductor die 218. In one embodiment, the adhesive material 238 is a nonconductive adhesive material and the upper portion 208, the side walls 210, and the light barrier 212 are formed from a nonconductive material (e.g., a plastic material). In another embodiment, the adhesive material 238 is a conductive adhesive material and the upper portion 208, the side walls 210, and the light barrier 212 are formed from a conductive material (e.g., a metallic material or a metal-plated material).

The cap 202 is formed from a conventional material that does not transmit light therethrough. For example, the cap 202 may be formed from a black material. The lower surfaces of the side walls 210 and the upper surface of the substrate 226 are flat. Additionally, the lower surface of the light barrier 212 and the upper surface of the semiconductor die 218 are flat. When the cap 202 is attached to the semiconductor die 218 and to the substrate 226, the upper portion of the cap 202 and the side walls 210 prevent external light from entering the proximity sensor 200, other than light that enters via the first aperture 204 and the second aperture 206. Additionally, the light barrier 212 blocks light emitted by the light emitting device 214 from reaching the sensor area 220 of semiconductor die 218, other than light that exits the first aperture 204, that is reflected by an object in the vicinity of the proximity sensor 200, and that enters the proximity sensor 200 via the second aperture 206.

During operation of the proximity sensor 200, electrical power is provided to the proximity sensor 200 through a first contact pad 228 on the lower surface of the substrate 226. The electrical power may be supplied to the semiconductor die 218 from the first contact pad 228 via a first conductive trace 230 connected to a second contact pad 228 on the upper surface of the substrate 226, which is connected to a first wire 232 that is connected to a first contact pad 222 on the upper surface of the semiconductor die 218. A common reference potential (e.g., ground) may be provided to the proximity sensor 200 through a third contact pad 228 on the lower surface of the substrate 226. The common reference potential may be supplied to the semiconductor die 218 from the third contact pad 228 via a second conductive trace 230 connected to a fourth contact pad 228 on the upper surface of the substrate 226, which is connected to a second wire 232 that is connected to a second contact pad 222 on the upper surface of the semiconductor die 218.

Additionally, the electrical power and the common reference potential are supplied to respective contact pads 216 of the light emitting device 214, which are in electrical communication with respective contact pads 222 on the upper surface of the semiconductor die 218. A driver within the semiconductor die 218 causes the light emitting device 214 to emit light through the first aperture 204 at predetermined times. Light emitted by the light emitting device 214 that is reflected by an object in the vicinity of the proximity sensor 200 may pass through the second aperture 206 and impact the sensor area 220 of the semiconductor die 218. In one embodiment, the semiconductor die 218 outputs a signal indicative of the intensity of light that is incident on the sensor area 220. In one embodiment, the semiconductor die 218 outputs a signal indicative of the distance between the proximity sensor 200 and the object. The signal from the semiconductor die 218 is output from the proximity sensor 200 via one of the contact pads 228 on the lower surface of the substrate 226.

One specific benefit of the design of FIG. 2B as described herein is the small footprint of the entire sensor. Namely, looking at the top side view of FIG. 2A, the footprint is the width times the length, namely the area occupied by the sensor. The footprint of this sensor is substantially smaller than any prior sensor. This is particular possible because both the light-emitting diode 214 and the light block layer 212 are positioned in the same area as the sensor chip 218. Therefore, the footprint of the sensor chip 218 substantially describes and defines the footprint of the entire device. By placing both the light blocking layer 212 and the diode 214 overlying and on top of the sensor chip 218, the footprint of the device can be substantially reduced.

In order to safely and securely mount the two structures over the sensor chip 218, the appropriate passivation layers are provided. In one embodiment, the passivation layers are silicon carbine as a thick layer overlying a layer of silicon nitride. In other embodiments, a thick layer of silicon nitride is provided which is somewhat thicker than would normally be used in a die which is packaged and encapsulated in an epoxy layer.

Figure 3A:
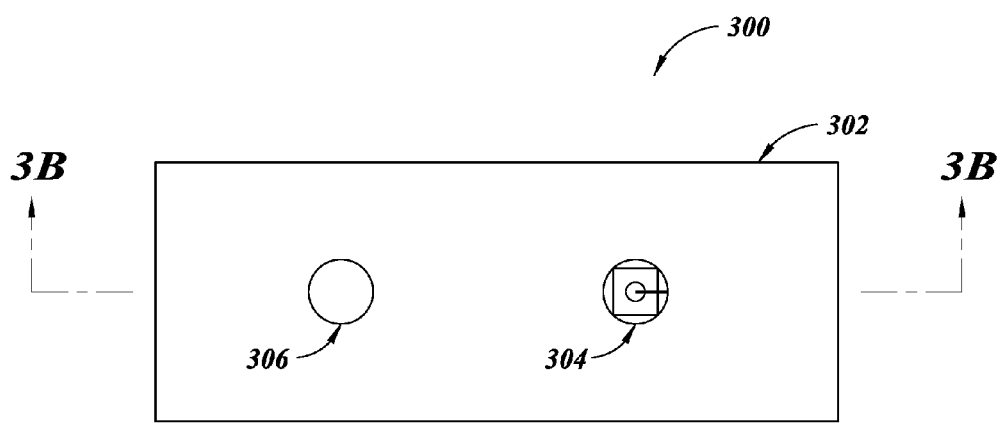
FIG. 3A is a top plan view of a proximity sensor, according to one embodiment.
Figure 3B:
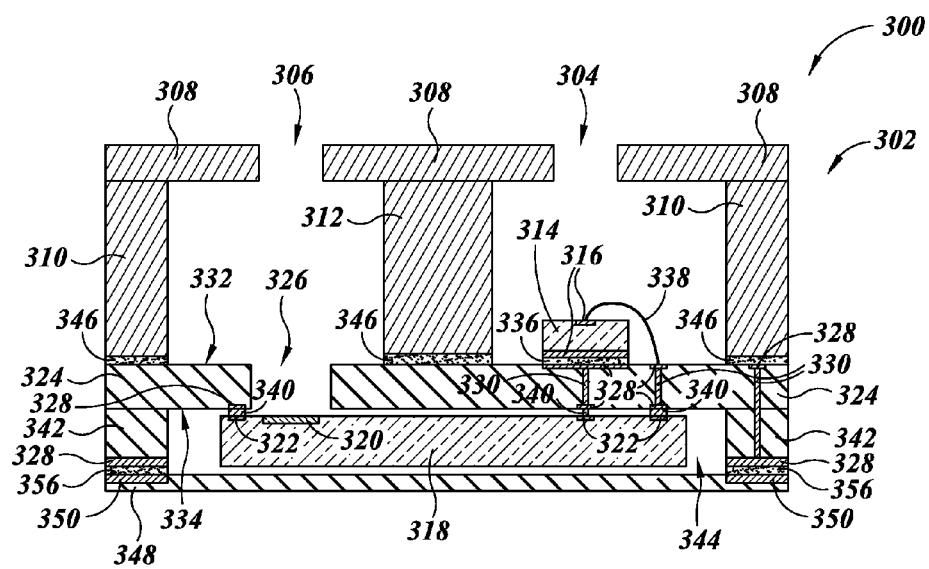
FIG. 3B is a cross-sectional view of the proximity sensor shown in FIG. 3A.

FIG. 3A is a top view of a proximity sensor 300, according to one embodiment. The proximity sensor 300 includes a cap 302 having a first aperture 304 and a second aperture 306. The first aperture 304 and the second aperture 306 may be filled or covered by conventional lenses formed from glass, plastic, or epoxy materials, for example, that are attached to the cap 302 using a conventional gluing process or a conventional molding process. FIG. 3B is a cross-sectional view of the proximity sensor 300 along the line 3B-3B shown in FIG. 3A.

As shown in FIG. 3B, the cap 302 includes an upper portion 308, a plurality of side walls 310, and a light barrier 312. In one embodiment, the upper portion 308, the side walls 310, and the light barrier 312 are integrally formed. In one embodiment, the side walls 310 and light barrier 312 are attached to the upper portion 308 with an adhesive material (not shown). In one embodiment, the side walls 310 are part of a substrate 324, which will be explained further below.

The proximity sensor 300 includes a conventional light emitting device 314 having a plurality of contact pads 316. In the embodiment shown in FIGS. 3A and 3B, an upper surface of the light emitting device 314 includes a first contact pad 316 and a lower surface of the light emitting device 314 includes a second contact pad 316. In another embodiment, a pair of contact pads 316 is formed on the lower surface of the light emitting device 314. In one embodiment, the light emitting device 314 is a conventional light emitting diode (LED). In one embodiment, the light emitting device 314 is a conventional vertical-cavity surface-emitting laser (VCSEL).

The proximity sensor 300 also includes a conventional semiconductor die 318. The semiconductor die 318 includes a sensor area 320 and a plurality of contact pads 322. In one embodiment, the sensor area 320 is part of a photodiode. In the embodiment shown in FIG. 3B, an upper surface of the semiconductor die 318 includes the contact pads 322.

The light emitting device 314 and the semiconductor die 318 are secured to the substrate 324. In one embodiment, the substrate 324 is part of a printed circuit board. In another embodiment, the substrate 324 is part of a redistribution layer. In one embodiment, the substrate 324 is formed from silicon. In another embodiment, the substrate 324 is formed from a ceramic material.

The substrate 324 includes an aperture 326, a plurality of contact pads 328, and a plurality of conductive traces 330. A first side 332 of the substrate 324 includes an upper surface of the substrate 324 and a second side 334 of the substrate 324 includes a lower surface of the substrate 324. The conductive traces 330 form electrical connections between one or more of the contact pads 328 on the upper surface of the substrate 324 and one or more of the contact pads 328 on the lower surface of the substrate 324.

A conventional, conductive adhesive material 336 forms an electrical connection between one of the contact pads 328 on the upper surface of the substrate 324 and one of the contact pads 316 on the lower surface of the light emitting device 314. The adhesive material 336 also secures the light emitting device 314 to the upper surface of the substrate 324. A wire 338 forms an electrical connection between one of the contact pads 328 on the upper surface of the substrate 324 and one of the contact pads 316 on the upper surface of the light emitting device 314.

A plurality of electrical connectors 340 forms electrical connections between the contact pads 328 on the lower surface of the substrate 324 and the contact pads 322 on the upper surface of the semiconductor die 318. The electrical connectors 340 also secure the semiconductor die 318 to the substrate 324. In one embodiment, the electrical connectors 340 are formed from a conventional, anisotropic conductive adhesive material with gold bumps on the semiconductor die 318. In another embodiment, the electrical connectors 340 are solder bumps formed from a conventional soldering material.

As shown in FIG. 3B, the semiconductor die 318 is secured to the lower surface of the substrate 324 such that the aperture 326 is disposed over the sensor area 320 of the semiconductor die 318. The aperture 326 is disposed between the second aperture 306 and the sensor area 320 of the semiconductor die 318, which enables light entering the proximity sensor 300 via the second aperture to reach the sensor area 320 of the semiconductor die 318.

The proximity sensor 300 also includes side walls 342 formed from a conventional material that extends downwardly from the substrate 324. In one embodiment, the side walls 342 and the substrate 324 are integrally formed. In one embodiment, the side walls 342 are secured to the lower surface of the substrate 324 with a conventional adhesive material (not shown). The side walls 342 and the substrate 324 form a cavity 344 in which the semiconductor die 318 is disposed.

A conventional adhesive material 346 secures the cap 302 to the upper surface of the substrate 324. The cap 302 is formed from a conventional material that does not transmit light therethrough. For example, the cap 302 may be formed from a black material. The lower surfaces of the side walls 310, the lower surface of the light barrier 312, and the upper surface of the substrate 324 are flat. When the cap 302 is attached to the substrate 324, the upper portion of the cap 302 and the side walls 310 prevent external light from entering the proximity sensor 300, other than light that enters via the first aperture 304 and the second aperture 306. Additionally, the light barrier 312 blocks light emitted by the light emitting device 314 from reaching the sensor area 320 of semiconductor die 318, other than light that exits the first aperture 304, that is reflected by an object in the vicinity of the proximity sensor 300, and that enters the proximity sensor 300 via the second aperture 306.

The proximity sensor 300 may include a substrate 348. In one embodiment, the substrate 348 is formed from silicon. In one embodiment, the substrate 348 is a flexible substrate formed from a conventional material. The substrate 348 includes a plurality of contact pads 350 on an upper surface of the substrate 348.

A conventional, conductive adhesive material 356 may form electrical connections between contact pads 328 on lower surfaces of the side walls 342 and respective contact pads 350 on the upper surface of the substrate 348. The adhesive material 356 also secures the upper surface of the substrate 348 to lower surfaces of the side walls 342. In one embodiment, the adhesive material 356 is a conventional, anisotropic conductive paste. In another embodiment, the adhesive material 356 is a conventional solder paste that undergoes a reflow process to form the electrical connections between the contact pads 328 on lower surfaces of the side walls 342 and the contact pads 350 on the upper surface of the substrate 348.

In one embodiment, portions of the cavity 344 that are not disposed between the sensor area 320 and the second aperture 306 and that are not occupied by semiconductor die 318 and the electrical connectors 340 are filled with a conventional filler material (not shown), such an epoxy resin, which can improve the durability of the proximity sensor 300.

During operation of the proximity sensor 300, electrical power is provided to the proximity sensor 300 through a first contact pad 350 on the upper surface of the substrate 348. A common reference potential (e.g., ground) may be provided to the proximity sensor 300 through a second contact pad 350 on the upper surface of the substrate 348.

Additionally, the electrical power and the common reference potential are supplied to respective contact pads 316 of the light emitting device 314, which are in electrical communication with respective contact pads 322 on the upper surface of the semiconductor die 318 via respective contact pads 328 and conductive traces 330 of the substrate 324. A driver within the semiconductor die 318 causes the light emitting device 314 to emit light through the first aperture 304 at predetermined times. Light emitted by the light emitting device 314 that is reflected by an object in the vicinity of the proximity sensor 300 may enter the second aperture 306 and impact the sensor area 320 of the semiconductor die 318. In one embodiment, the semiconductor die 318 outputs a signal indicative of the intensity of light that is incident on the sensor area 320. In one embodiment, the semiconductor die 318 outputs a signal indicative of the distance between the proximity sensor 300 and the object. The signal from the semiconductor die 318 is output from the proximity sensor 300 via one of the contact pads 350 on the lower surface of the substrate 348.

The embodiment of FIGS. 3A and 3B has some different advantages and structure than that provided in the embodiment of FIGS. 2A and 2B. Similar to the embodiment of FIGS. 2A and 2B, the footprint of the entire package is quite small, as defined mainly by the size of the footprint of the sensor die 318. There are additional advantages provided by the package of FIG. 3B in the construction and strength. In particular, the substrate 324 has additional mechanical support beyond the mechanical support of the standalone sensor die 218. It may be common in some situations that the sensor die 318 is somewhat fragile or, in order to have higher yields, it is desired to not place structures directly on top of the die. Accordingly, the structure of FIG. 3B provides the advantage that the diode 314 and light blocking layer 312 can be directly mounted on and abutting against a substrate layer 324. Accordingly, there is no need for mechanical connection to nor support by the sensor die 318.

Figure 4A:
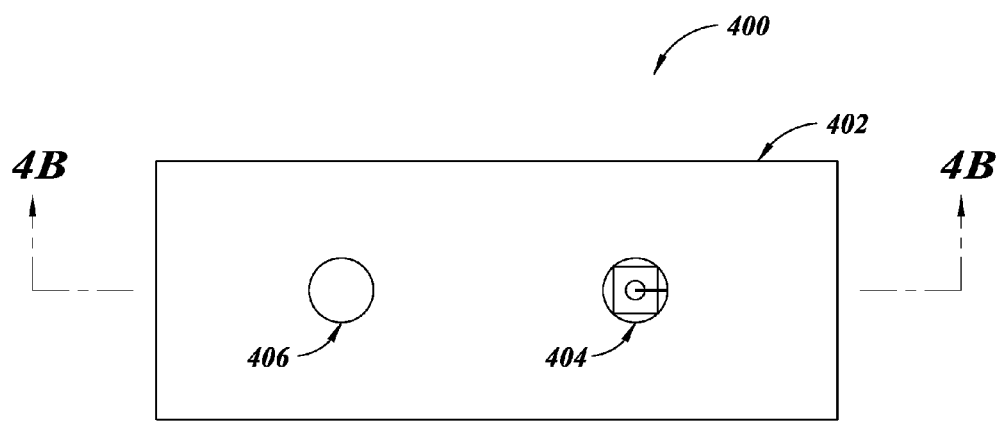
FIG. 4A is a top plan view of a proximity sensor, according to one embodiment.
Figure 4B:
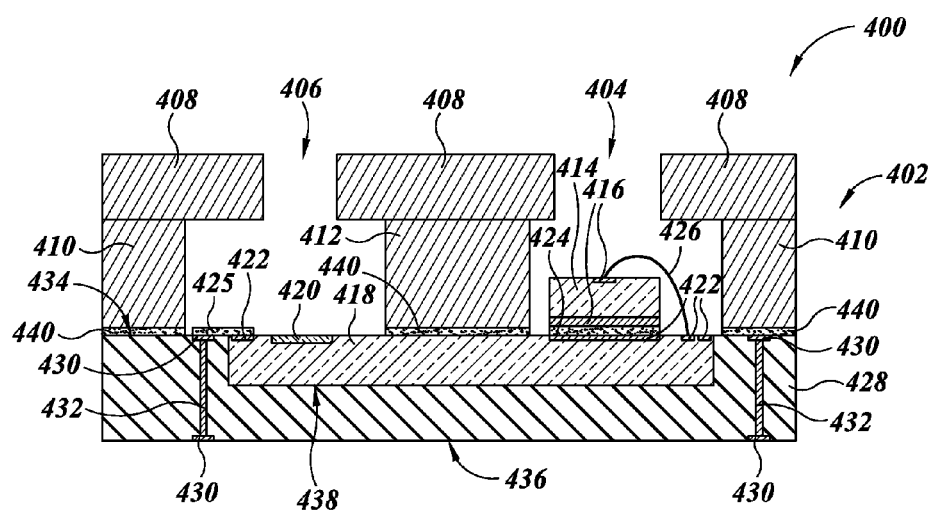
FIG. 4B is a cross-sectional view of the proximity sensor shown in FIG. 4A.

FIG. 4A is a top view of a proximity sensor 400, according to one embodiment. The proximity sensor 400 is similar in many relevant respects to the proximity sensor 200 shown in FIGS. 2A and 2B. The proximity sensor 400 includes a cap 402 having a first aperture 404 and a second aperture 406. The first aperture 404 and the second aperture 406 may be filled or covered by conventional lenses to improve the optical performance of the proximity sensor 400. Such lenses may be formed from glass, plastic, or epoxy materials, for example, that are attached to the cap 402 using a conventional gluing process or a conventional molding process. FIG. 4B is a cross-sectional view of the proximity sensor 400 along the line 4B-4B shown in FIG. 4A.

As shown in FIG. 4B, the cap 402 includes an upper portion 408, a plurality of side walls 410, and a light barrier 412. In one embodiment, the upper portion 408, the side walls 410, and the light barrier 412 are integrally formed. In one embodiment, the side walls 410 and light barrier 412 are attached to the upper portion 408 with an adhesive material (not shown). In one embodiment, the side walls 410 are part of a substrate 428, which will be explained further below.

The proximity sensor 400 includes a conventional light emitting device 414 having a plurality of contact pads 416. In the embodiment shown in FIGS. 4A and 4B, an upper surface of the light emitting device 414 includes a first contact pad 416 and a lower surface of the light emitting device 414 includes a second contact pad 416. In another embodiment, a pair of contact pads 416 is formed on the lower surface of the light emitting device 414. In one embodiment, the light emitting device 414 is a conventional light emitting diode (LED). In one embodiment, the light emitting device 414 is a conventional vertical-cavity surface-emitting laser (VCSEL).

The proximity sensor 400 also includes a conventional semiconductor die 418. The semiconductor die 418 includes a sensor area 420 and a plurality of contact pads 422. In one embodiment, the sensor area 420 is part of a photodiode. In the embodiment shown in FIG. 4B, an upper surface of the semiconductor die 418 includes the contact pads 422. A conventional epoxy adhesive material 424 secures one of the contact pads 416 on the lower surface of the light emitting device 414 to a contact pad 422 on the upper surface of the semiconductor die 418. In one embodiment, the adhesive material 424 is a conventional, conductive die attach adhesive. A wire 426 forms an electrical connection between one of the contact pads 422 on the upper surface of the semiconductor die 418 and the contact pad 416 on the upper surface of the light emitting device 5 414.

The substrate 428 includes a plurality of contact pads 430. An upper surface of the substrate 428 includes some of the contact pads 430 and a lower surface of the substrate 428 includes some of the contact pads 430. A plurality conductive traces 432 forms electrical connections between one or more of the contact pads 430 on the upper surface of the substrate 428 and one or more of the contact pads 430 on the lower surface of the substrate 428. In one embodiment, the substrate 428 is part of a printed circuit board. In another embodiment, the substrate 428 is part of a redistribution layer. In one embodiment, the substrate 428 is formed from silicon. In another embodiment, the substrate 428 is formed from a ceramic material. A plurality of conductive traces 425 forms electrical connections between contact pads 430 on the upper surface of the substrate 428 and contact pads 422 on the upper surface of the semiconductor die 418.

The substrate 428 has a first side 434 and an opposing second side 436. A cavity 438 is formed on the first side 434 of the substrate 428. In one embodiment, the cavity 438 has approximately the same dimensions as the semiconductor die 418 and the semiconductor die 418 is disposed entirely within the cavity 438. In one embodiment, an adhesive material (not shown) secures the lower surface of the semiconductor die 418 to the substrate 428. In one embodiment, the upper surface of the semiconductor die 418 is flush with the upper surface of the substrate 428, and the sidewalls 410 and the light barrier 412 have the same height.

In one embodiment, the cavity 438 has dimensions that are larger than those of the semiconductor die 418. The semiconductor die 418 is positioned inside the cavity 438 within the substrate 428 and a conventional molding process is used to form a molding material (not shown) in portions of the cavity 438 that are not occupied by the semiconductor die 418. A plurality of electrical connections are formed through vias in the molding material between contact pads 422 of the semiconductor die 418 and respective contact pads 430 of a redistribution layer on the first side 434 of the substrate 428, which are in electrical communication with contact pads 430 on the second side 436 of the substrate 428. The light emitting device 414 and the cap 402 are positioned on the semiconductor die 418 and/or the first side 434 of the substrate 428.

A conventional adhesive material 440 secures the cap 402 to the semiconductor die 418 and to the substrate 428. More particularly, the adhesive material 440 secures the side walls 410 to an upper surface of the substrate 428. Although FIG. 4B shows only two side walls 410, the cap 402 includes four side walls 410. The adhesive material 440 also secures the light barrier 412 to an upper surface of the semiconductor die 418. In one embodiment, the cap 402 is formed from a conductive material and the adhesive material 440 is a conductive adhesive material that forms an electrical connection between the cap 402 and at least one of the contact pads 430 on the upper surface of the substrate 428, which is electrically coupled to at least one of the contact pads 430 on the lower surface of the substrate 428 via at least one of the conductive traces 432.

The cap 402 is formed from a conventional material that does not transmit light therethrough. For example, the cap 402 may be formed from a black material. The lower surfaces of the side walls 410 and the upper surface of the substrate 428 are flat. Additionally, the lower surface of the light barrier 412 and the upper surface of the semiconductor die 418 are flat. When the cap 402 is attached to the semiconductor die 418 and to the substrate 428, the upper portion of the cap 402 and the side walls 410 prevent external light from entering the proximity sensor 400, other than light that enters via the first aperture 404 and the second aperture 406. Additionally, the light barrier 412 blocks light emitted by the light emitting device 414 from reaching the sensor area 420 of semiconductor die 418, other than light that exits the first aperture 404, that is reflected by an object in the vicinity of the proximity sensor 400, and that enters the proximity sensor 400 via the second aperture 406.

During operation of the proximity sensor 400, electrical power is provided to the proximity sensor 400 through a first contact pad 430 on the lower surface of the substrate 428. The electrical power may be supplied to the semiconductor die 418 from the first contact pad 430 via a first conductive trace 432 connected to a second contact pad 430 on the upper surface of the substrate 428, which is connected to a first conductive trace 425 that is connected to a first contact pad 422 on the upper surface of the semiconductor die 418. A common reference potential (e.g., ground) may be provided to the proximity sensor 400 through a third contact pad 430 on the lower surface of the substrate 428. The common reference potential may be supplied to the semiconductor die 418 from the third contact pad 430 via a second conductive trace 432 connected to a fourth contact pad 430 on the upper surface of the substrate 428, which is connected to a second conductive trace 425 that is connected to a second contact pad 422 on the upper surface of the semiconductor die 418.

Additionally, the electrical power and the common reference potential are supplied to respective contact pads 416 of the light emitting device 414, which are in electrical communication with respective contact pads 422 on the upper surface of the semiconductor die 418. A driver within the semiconductor die 418 causes the light emitting device 414 to emit light through the first aperture 404 at predetermined times. Light emitted by the light emitting device 414 that is reflected by an object in the vicinity of the proximity sensor 400 may pass through the second aperture 406 and impact the sensor area 420 of the semiconductor die 418. In one embodiment, the semiconductor die 418 outputs a signal indicative of the intensity of light that is incident on the sensor area 420. In one embodiment, the semiconductor die 418 outputs a signal indicative of the distance between the proximity sensor 400 and the object. The signal from the semiconductor die 418 is output from the proximity sensor 400 via one of the contact pads 430 on the lower surface of the substrate 428.

Figure 5:
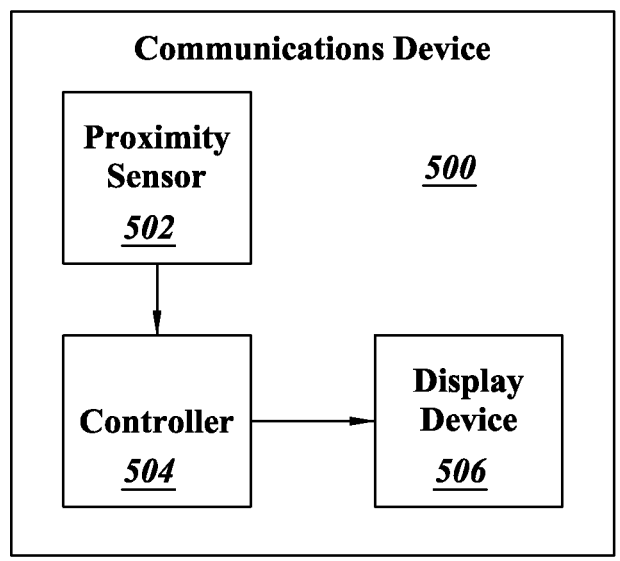
FIG. 5 is a block diagram of a communication device, according to one embodiment.

FIG. 5 is a block diagram of a communication device 500, according to one embodiment. The communication device 500 includes a proximity sensor 502, a controller 504, and a display device 506. In one embodiment, the communication device 500 is a cellular telephone, the proximity sensor 502 is one of the proximity sensors 200, 300, and 400 described above, and the display device 506 is a touchscreen device. If the proximity sensor 502 is not near the body of a user, for example, the proximity sensor 502 outputs to the controller 504 a first signal indicating that little, if any, light output from the proximity sensor 502 has been reflected from the user's body and returned to the proximity sensor 502. When the controller 504 receives the first signal from the proximity sensor 502, the controller 504 provides to the display device 506 a first control signal that enables the display device 506 and/or causes a back light of the display device 506 to output a predetermined maximum amount of light.

The proximity sensor 502 may be located near a speaker (not shown) of the communication device 500. If the proximity sensor 502 is positioned near the user's body (e.g., the user's ear) the proximity sensor 502 outputs to the controller 504 a second signal indicating that at least a predetermined amount of light output from the proximity sensor 502 has been reflected from the user's body and returned to the proximity sensor 502. When the controller 504 receives the second signal from the proximity sensor 502, the controller 504 provides to the display device 506 a second control signal that disables the display device 506 and/or causes the back light of the display device 506 to output a predetermined minimum amount of light. Accordingly, the proximity sensor 502 may be used to reduce power consumption of the communications device 500.

In one embodiment, the proximity sensor 502 is a proximity and ranging sensor that performs ranging measurements. That is, the proximity sensor 502 determines how far objects are from the proximity sensor 502. For example, the proximity sensor 502 stores a first time when a pulse of light is emitted from the proximity sensor 502 and stores a second time when the light that is reflected by an object returns to the proximity sensor 502. The proximity sensor 502 determines a distance of the object from the proximity sensor 502 based on the difference between first the time and the second time and the speed of light, according to conventional techniques. Such proximity and ranging sensors can be used in gaming applications, for example.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A proximity sensor, comprising:
   a first substrate having a first plurality of contact pads on a first side of the first substrate and a second plurality of contact pads on a second side of the first substrate;
   a semiconductor die having a sensor area on an upper surface of the semiconductor die and a third plurality of contact pads, the semiconductor die being secured to the first substrate;
   a light emitting device having a fourth plurality of contact pads, the light emitting device overlying the upper surface of the semiconductor die; and
   a cap having a first aperture positioned above the light emitting device, a second aperture positioned above the sensor area of the semiconductor die, and a light barrier disposed between the light emitting device and the sensor area of the semiconductor die, the cap being secured to the first substrate, wherein the light barrier is secured to the semiconductor die.

2. The proximity sensor of claim 1 wherein the first substrate includes a cavity and the semiconductor die is positioned in the cavity.

3. The proximity sensor of claim 1 wherein the semiconductor die is positioned on the first side of the first substrate, the light emitting device is positioned on the upper surface of the semiconductor die, and each of the fourth plurality of contact pads of the light emitting device is in electrical communication with a respective one of the third plurality of contact pads of the semiconductor die.

4. The proximity sensor of claim 1, further comprising: an adhesive material that secures a lower surface of the semiconductor die to the first side of the first substrate.

5. The proximity sensor of claim 1, further comprising: a wire forming an electrical connection between one of the third plurality of contact pads of the semiconductor die and one of the fourth plurality of contact pads of the light emitting device.

6. The proximity sensor of claim 1, further comprising: a plurality of wires, each of the wires forming an electrical connection between one of the first plurality of contact pads on the first side of the first substrate and a respective one of the third plurality of contact pads of the semiconductor die.

7. The proximity sensor of claim 1 wherein the light emitting device is positioned on the first side of the first substrate and the semiconductor die is positioned on the second side of the first substrate with the sensor area facing the first substrate.

8. The proximity sensor of claim 1 wherein each of the second plurality of contact pads on the second side of the first substrate is in electrical communication with a respective one of the third plurality of contact pads of the semiconductor die.

9. The proximity sensor of claim 1, further comprising a wire forming an electrical connection between one of the first plurality of contact pads on the first side of the first substrate and one of the fourth plurality of contact pads of the light emitting device.

10. The proximity sensor of claim 1, further comprising: a plurality electrical connectors, each of the electrical connectors forming an electrical connection between one of the second plurality of contact pads on the second side of the first substrate and a respective one of the third plurality of contact pads of the semiconductor die.

11. The proximity sensor of claim 1 wherein the light barrier is secured to the first side of the first substrate.

12. The proximity sensor of claim 1 wherein an aperture is formed in the first substrate, the semiconductor die is positioned with its upper surface facing the first substrate, and the aperture is positioned over the sensor area of the semiconductor die.

13. The proximity sensor of claim 1, further comprising: a second substrate having a fifth plurality of contact pads, each of the fifth plurality of contact pads being in electrical communication with a respective one of the second plurality of contact pads of the first substrate.

14. A method of fabricating a proximity sensor, comprising:
   providing a first substrate having a first plurality of contact pads on a first side of the first substrate and a second plurality of contact pads on a second side of the first substrate;
   coupling a semiconductor die to the first substrate, the semiconductor die having a sensor area on an upper surface of the semiconductor die and a third plurality of contact pads;
   positioning a light emitting device over the upper surface of the semiconductor die, the light emitting device having a fourth plurality of contact pads; and
   coupling a cap to the first substrate, the cap having a light barrier disposed between the light emitting device and the sensor area of the semiconductor die; and
   coupling the light barrier to the upper surface of the semiconductor die.

15. The method of claim 14, further comprising:
positioning the semiconductor die on the first side of the first substrate;
positioning the light emitting device on the upper surface of the semiconductor die;
forming a first plurality of electrical connections, each of the first plurality of electrical connection being formed between one of the third plurality of contact pads of the semiconductor die and a respective one of the fourth plurality of contact pads of the light emitting device; and
forming a second plurality of electrical connections, each of the second plurality of electrical connection being formed between one of the third plurality of contact pads of the semiconductor die and a respective one of the first plurality of contact pads on the first side of the first substrate.

16. The method of claim 14, further comprising:
positioning the light emitting device on the first side of first substrate;
forming a first plurality of electrical connections, each of the first plurality of electrical connection being formed between one of the fourth plurality of contact pads of the light emitting device and a respective one of the first plurality of contact pads on the first side of the first substrate;
positioning the semiconductor die on the second side of the first substrate and
forming a second plurality of electrical connections, each of the second plurality of electrical connection being formed between one of the third plurality of contact pads of the semiconductor die and a respective one of the second plurality of contact pads on the second side of the first substrate.

17. The method of claim 14, further comprising:
providing a second substrate having a fifth plurality of contacts pads; and
forming a plurality of electrical connections, each of the electrical connections being formed between one of the second plurality of contact pads of the first substrate and a respective one of the fifth plurality of contact pads of the second substrate.

18. The method of claim 14 wherein the first substrate has a cavity, and the method includes positioning the semiconductor die in the cavity.

19. A proximity sensor, comprising:
a first substrate having a first plurality of contact pads on a first side of the first substrate and a second plurality of contact pads on a second side of the first substrate;
a semiconductor die having a sensor area on an upper surface of the semiconductor die and a third plurality of contact pads, the semiconductor die being secured to the first substrate;
a light emitting device having a fourth plurality of contact pads, the light emitting device overlying the upper surface of the semiconductor die, wherein the light emitting device is positioned on the first side of the first substrate and the semiconductor die is positioned on the second side of the first substrate with the sensor area facing the first substrate; and
a cap having a first aperture positioned above the light emitting device, a second aperture positioned above the sensor area of the semiconductor die, and a light barrier disposed between the light emitting device and the sensor area of the semiconductor die, the cap being secured to the first substrate.

20. The proximity sensor of claim 19 wherein an aperture is formed in the first substrate, the semiconductor die is positioned with its upper surface facing the first substrate, and the aperture is positioned over the sensor area of the semiconductor die.

* * * * *